United States Patent
Deligianni et al.

(10) Patent No.: US 11,107,878 B2
(45) Date of Patent: Aug. 31, 2021

(54) HIGH RESISTIVITY IRON-BASED, THERMALLY STABLE MAGNETIC MATERIAL FOR ON-CHIP INTEGRATED INDUCTORS

(71) Applicant: International Business Machines Corporation, Armonk, NY (US)

(72) Inventors: Hariklia Deligianni, Alpine, NY (US); William J. Gallagher, Ardsley, NY (US); Maurice Mason, Danbury, CT (US); Eugene J. O'Sullivan, Nyack, NY (US); Lubomyr T. Romankiw, Briancliff Manor, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 382 days.

(21) Appl. No.: 14/666,612

(22) Filed: Mar. 24, 2015

(65) Prior Publication Data

US 2016/0284786 A1     Sep. 29, 2016

(51) Int. Cl.
*H01F 1/04*     (2006.01)
*H01L 49/02*    (2006.01)
(Continued)

(52) U.S. Cl.
CPC ............. *H01L 28/10* (2013.01); *H01F 1/04* (2013.01); *H01F 1/047* (2013.01); *H01F 41/02* (2013.01);
(Continued)

(58) Field of Classification Search
None
See application file for complete search history.

(56) References Cited

U.S. PATENT DOCUMENTS 3,385,725 A * 5/1968 Schmeckenbecher ..................... C22C 19/00
106/1.22
3,483,029 A * 12/1969 Koretzky ............... C23C 18/50
427/129

(Continued)

FOREIGN PATENT DOCUMENTS

JP         09171925 A    *  6/1997

OTHER PUBLICATIONS

Rayne, J. A., and R. A. Levy. "Resistivity of Metglas Alloys from 1.5 K to 800 K*." Amorphous Magnetism II (1977): 319-326.*

(Continued)

*Primary Examiner* — Holly Rickman
*Assistant Examiner* — Lisa Chau
(74) *Attorney, Agent, or Firm* — Cantor Colburn LLP; Robert Sullivan

(57) ABSTRACT

An on-chip magnetic structure includes a palladium activated seed layer and a substantially amorphous magnetic material disposed onto the palladium activated seed layer. The substantially amorphous magnetic material includes nickel in a range from about 50 to about 80 atomic % (at. %) based on the total number of atoms of the magnetic material, iron in a range from about 10 to about 50 at. % based on the total number of atoms of the magnetic material, and phosphorous in a range from about 0.1 to about 30 at. % based on the total number of atoms of the magnetic material. The magnetic material can include boron in a range from about 0.1 to about 5 at. % based on the total number of atoms of the magnetic material.

7 Claims, 9 Drawing Sheets

(51) Int. Cl.
  *H01L 21/288* (2006.01)
  *H01L 23/522* (2006.01)
  *H01L 23/532* (2006.01)
  *H01F 41/26* (2006.01)
  *H01F 41/04* (2006.01)
  *H01F 41/02* (2006.01)
  *H01F 1/047* (2006.01)

(52) U.S. Cl.
  CPC ........... *H01F 41/046* (2013.01); *H01F 41/26* (2013.01); *H01L 21/288* (2013.01); *H01L 23/5227* (2013.01); *H01L 23/53209* (2013.01); *H01L 23/53242* (2013.01)

(56) References Cited

U.S. PATENT DOCUMENTS

| | | | |
|---|---|---|---|
| 3,772,056 | A | 11/1973 | Polichette et al. |
| 6,440,750 | B1 | 8/2002 | Feygenson et al. |
| 7,943,510 | B2 | 5/2011 | Takahashi et al. |
| 8,266,793 | B2 | 9/2012 | Lotfi et al. |
| 9,590,026 | B2 * | 3/2017 | Deligianni ............ H01L 28/10 |
| 9,793,336 | B2 * | 10/2017 | Deligianni ............ H01L 28/10 |
| 10,002,919 | B2 | 6/2018 | Deligianni et al. |
| 2002/0153258 | A1 * | 10/2002 | Filas ................ H01F 41/046 205/119 |
| 2004/0175845 | A1 | 9/2004 | Molla ................ H01L 27/222 438/3 |
| 2005/0221129 | A1 * | 10/2005 | Hamaguchi ............ G11B 5/667 428/846.1 |
| 2006/0210837 | A1 * | 9/2006 | Kurihara ............ C23C 18/1651 428/831 |
| 2008/0090079 | A1 | 4/2008 | Fajardo et al. |
| 2008/0199733 | A1 * | 8/2008 | Oka ........................ G11B 5/65 428/810 |
| 2016/0015051 | A1 | 1/2016 | Belliveau |
| 2017/0229533 | A1 | 8/2017 | Deligianni et al. |

OTHER PUBLICATIONS

Freitag et al. "The Electrodeposition of Nickel-Iron-Phosphorus Thin Films for Computer Memory Use," Journal of the Electrochemical Society III (1964): 35-39.*

Luborsky et al. "Magnetic Annealing of Amorphous Alloys." IEEE Transactions on Magnetics, Jul. 14, 1975, pp. 1644-1649.*

List of IBM Patents or Patent Applications Treated as Related—Date Filed: Aug. 6, 2015; 1 page.

Hariklia Deligianni, et al.; "High Resistivity Iron-Based, Thermally Stable Magnetic Material for On-Chip Integrated Inductors"; U.S. Appl. No. 14/744,124, filed Jun. 19, 2015.

Luo, Yu, et al.; "Development of Electroless Nickel-Iron Plating Process for Microelectronic Applications"; 2014 Electronic Components & Technology Conference; p. 1782-1789; 2014.

Panda, Amrit, et al.; "A Unique Magnetic Alloy for Integrated Powe Systems on a Chip"; ECS Transactions; Downloaded on May 30, 2013; vol. 50, No. 10; p. 107-118; 2012.

Wang, Lingling, et al.; "Composition, Structure and Corrosion Characteristics of Ni—Fe—P and Ni—Fe—P—B Alloy Deposits Prepared by Electroless Plating"; Surface and Coatings Technology; vol. 126, No. 2-3; p. 272-278; Apr. 24, 2000.

List of IBM Patents or Patent Applications Treated as Related; (Appendix P), Filed Aug. 15, 2017; 2 pages.

List of IBM Patents or Patent Applications Treated as Related—Date Filed: Nov. 1, 2018; 2 pages.

* cited by examiner

HIGH RESISTIVITY IRON-BASED, THERMALLY STABLE MAGNETIC MATERIAL FOR ON-CHIP INTEGRATED INDUCTORS

STATEMENT OF GOVERNMENT INTEREST

This invention was made with Government support under Contract No.: University of California Subcontract No. B601996, awarded by Department of Energy. The Government has certain rights in this invention.

BACKGROUND

The present invention relates to magnetic materials, and more specifically, to magnetic materials for miniaturized power converters.

The technologies for power conversion devices are transitioning from on-board collections of discrete components to compactly packaged collections of power conversion components on increasingly smaller scales. However, the miniature compact packages may need to be supplemented with additional discrete inductive components.

On-chip inductive components include high energy density materials, such as magnetic materials. Ferrite-based materials and metallic alloys are examples of magnetic materials. Such materials can have thicknesses ranging from hundreds of nanometers (nm) to a few microns. However, ferrite materials are generally processed at high temperatures (e.g., higher than 800° C.), which may not be compatible with complementary metal-oxide semiconductor (CMOS) chip wiring processing temperatures. NiFe, CoFe, and CoZrTa are examples of magnetic alloys.

Magnetic metals can be deposited by vacuum deposition technologies (e.g., sputtering), electrodeposition, and electroless deposition in aqueous solutions. Vacuum deposition methods can be used to deposit a large variety of magnetic materials. Electrodeposition is used for the deposition of thick metal films because of its high deposition rate, conformal coverage, and low cost. Vacuum methods, however, can suffer from low deposition rates, poor conformal coverage, and the derived magnetic films are difficult to pattern.

Compared to ferrite materials, magnetic alloys can have higher permeability and magnetic flux density, which are necessary to achieve high energy density for on-chip devices. However, the resistivity of magnetic alloys can be low (e.g., less than 100 micro-ohm ($\mu\Omega$)·centimeters (cm)). Further, because many on-chip devices are operated at high frequencies (e.g., higher than 10 megahertz (MHz)), large eddy currents can be induced within magnetic core. Eddy currents are circular electric currents induced within conductors by a changing magnetic field and result high AC losses at high frequencies. One method to reduce eddy currents is to increase the resistivity of the soft magnetic material so that the eddy currents are confined within each individual magnetic layer. Also, thinner magnetic layers have a larger effective magnetic resistance, which results in smaller eddy currents.

SUMMARY

According to an embodiment of the present invention, an on-chip magnetic structure includes a palladium activated seed layer; and a substantially amorphous magnetic material disposed onto the palladium activated seed layer and comprising nickel in a range from about 50 to about 80 atomic % (at. %) based on the total number of atoms of the magnetic material, iron in a range from about 10 to about 50 at. % based on the total number of atoms of the magnetic material, and phosphorous in a range from about 0.1 to about 30 at. % based on the total number of atoms of the magnetic material.

According to another embodiment, a method for forming an on-chip magnetic structure includes activating a magnetic seed layer with a palladium solution to form a palladium-activated magnetic seed layer, the magnetic seed layer being positioned over a semiconductor substrate; and electrolessly plating a magnetic alloy onto the palladium-activated seed layer to form an amorphous soft magnetic layer; wherein the amorphous soft magnetic layer comprises nickel in a range from about 50 to about 80 at. % based on the total number of atoms of the magnetic material, iron in a range from about 10 to about 50 at. % based on the total number of atoms of the magnetic material, and phosphorous in a range from about 0.1 to about 30 at. % based on the total number of atoms of the magnetic material.

Yet, according to another embodiment, a method for forming an on-chip magnetic structure includes activating a magnetic seed layer with palladium, the magnetic seed layer being positioned over a substrate; and electrolessly plating a soft magnetic alloy onto the palladium in the presence of a magnetic field bias; wherein the soft magnetic alloy comprises nickel in a range from about 50 to about 80 at % based on the total number of atoms of the soft metallic alloy, iron in a range from about 10 to about 50 at. % based on the total number of atoms of the soft metallic alloy, phosphorous in a range from about 0.1 to about 30 at. % based on the total number of atoms in the soft metallic alloy, and boron in a range from about 0.1 to about 5 at. % based on the total number of atoms of the soft magnetic alloy.

BRIEF DESCRIPTION OF THE DRAWINGS

The subject matter, which is regarded as the invention, is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
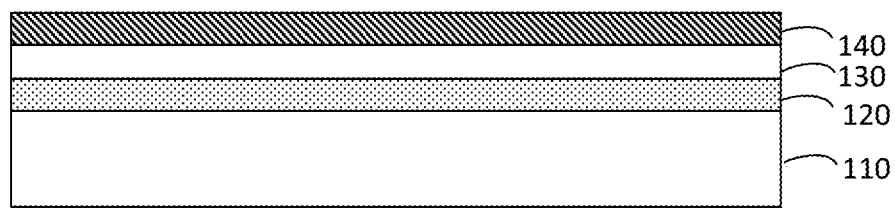
FIG. 1 is a cross-sectional view of a substrate having an adhesion layer, a seed layer, and a protective layer.

Disclosed herein are electroless plating methods and materials formed from such methods. The methods and materials are used to form on-chip magnetic structures, such as on-chip inductors or transformer structures, e.g., closed-yokes or shielded-slab structures.

In one embodiment, an on-chip magnetic structure includes a palladium-activated seed layer and a substantially amorphous magnetic material disposed onto the palladium-activated seed layer. The substantially amorphous magnetic material comprises nickel in a range from about 0.1 to about 80 at. %, iron in a range from about 0.1 to about 50 at. %, and phosphorous in a range from about 0.1 to about 30 at. %. The magnetic materials are referred to as Pd/NiFeP materials, films, and layers. In some embodiments, the magnetic materials further include boron and are referred to as Pd/NiFePB materials, films, and layers. When present, boron is in an amount in a range from about 0.1 to about 5 at. %.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "atomic percent," "atomic %" and "at. %" mean the percentage of atoms of a pure substance divided by the total number of atoms of a compound or composition, multiplied by 100.

It is to be understood that the on-chip magnetic structures will be described in terms of a given illustrative architectures having a wafer or semiconductor substrate. However, other architectures, structures, substrate materials, process features and steps may be varied.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment," as well any other variations, appearing in various places throughout the specification are not necessarily all referring to the same embodiment.

As used herein, the term "resistance" means the opposition to the passage of an electric current through a conductor. The resistance (R) of an object is defined as the ratio of voltage (V) across the object to current (I) through the object (R=V/I). Sheet resistance measurements herein are obtained with a Magnetron Instruments M700 4-point probe immediately after deposition, as well as after annealing. An average resistivity is calculated from the sheet resistance utilizing the total film thicknesses involved. The seed and plated layers have different resistivities, and the layer resistivity may vary within the individual layer thicknesses. However, the average value for a representative total thickness is characteristic of the resistivity what will be relevant in electrical usage As used herein, the term "coercivity," or "$H_c$," is a measure of the ability of a ferromagnetic material to withstand an external magnetic field without becoming demagnetized. Thus, the coercivity is the intensity of the applied magnetic field necessary to reduce the magnetization of that material to zero after the magnetization has been driven to saturation. Coercivity is reported in units of oersted (Oe) or ampere/meter. Ferromagnetic materials with high coercivity are called magnetically "hard" materials. Materials with low coercivity are magnetically "soft" materials. Coercivity is determined by measuring the material's magnetic hysteresis loop, also called the magnetization curve. Magnetic hysteresis loop measurements herein are performed using a Vibrating Sample Magnetometer (VSM), MicroSense Model 10, on about 1 inch square samples. The applied magnetic field is varied from about −100 Oe to about +100 Oe. The applied field where the data line crosses zero is the coercivity.

As used herein, the term "magnetic anisotropy" means the directional dependence of a material's magnetic properties. Depending on the orientation of the magnetic field with respect to the material's crystalline lattice, a lower or higher magnetic field is necessary to reach the saturation magnetization. The "easy axis" is the direction inside a crystal, along which a small applied magnetic field is sufficient to reach the saturation magnetization. The "hard axis" is the direction inside a crystal, along which a large applied magnetic field is needed to reach the saturation magnetization.

Referring now to the drawings in which like numerals represent the same or similar elements and initially to FIGS. 1-6, an exemplary electroless plating process for forming an on-chip magnetic component is illustratively shown. The magnetic components can be inductors, transformers, magnetic yokes, magnets, and the like.

Referring to FIG. 1, an optional adhesion layer 120 is deposited onto a substrate 110, which can be any semiconductor substrate. The adhesion layer 120 is used to improve the adhesion between a seed layer 130 and the substrate 110. The adhesion layer 120 may include chromium, manganese, tungsten, molybdenum, ruthenium, palladium, platinum, iridium, rhenium, rhodium, osmium, titanium, tantalum, tungsten nitride, molybdenum nitride, titanium nitride, tantalum nitride, ruthenium nitride, iridium nitride, rhenium nitride, rhodium nitride, osmium nitride, manganese nitride, or any combination thereof. Although, other materials may be employed in the adhesion layer 120. Seed layer 130 is deposited either onto substrate 110 or the adhesion layer 120. The substrate 110 may be part of a wafer or may be a stand-alone substrate. The substrate 110 may include silicon or other substrate material, e.g., GaAs, InP, SiC, or any combination thereof.

The seed layer 130 may be formed using a physical-vapor-deposition (PVD) process (e.g., sputtering) or an electroless/electrolytic deposition process. A bias magnetic field can be applied during seed layer 130 deposition to produce magnetic anisotropy. The seed layer 130 includes a metal or combination of metals with magnetic properties to form a magnetic or a non-magnetic seed layer. The seed layer 120 can include metals, such as nickel, cobalt, iron, manganese, boron, phosphorous, platinum, palladium, ruthenium, iridium, rhodium, rhenium, tungsten, molybdenum, titanium, tantalum, copper, gold, or any combination thereof.

In one embodiment, the seed layer 130 includes nickel in an amount in a range from about 0.1 to about 80 at. % and iron in an amount in a range from about 0.1 to about 50 at. %. For example, the seed layer 130 can include about 80 wt. % nickel and about 20 wt. % iron ($Ni_{80}Fe_{20}$). The seed layer 130 can have a thickness of at least 60 nm. Because the palladium activation (described below in FIG. 5) etches a portion of the seed layer 130, the seed layer 130 cannot be too thin. When the seed layer 130 is too thin, the electrolessly plated films or layers deposited thereon are more susceptible to degradation of coercive force even at low temperature. Thus, without being bound by theory, it is believed that adhesion and strain of films deposited on very thin seed layers is inadequate to create a stable amorphous microstructure, resulting in degradation of magnetic properties at low temperatures. In one embodiment, the seed layer 130 is from about 50 to about 70 nanometers (nm) thick. In another embodiment, the seed layer 130 is from about 45 to about 95 nm thick. Yet, in another embodiment, the seed layer 130 is from about 10 to about 200 nm thick. Still yet, the seed layer 130 is about or in any range from about 10, 20, 30, 40, 50, 60, 70, 80, 90, 100, 110, 120, 130, 140, 150, 160, 170, 180, 190, to 200 nm thick.

A top layer or protective layer 140, which is optional, may be employed to protect the seed layer 130. The top layer 140 may include, for example, titanium, although any metal or non-metal may be employed. The passive top layer 140 may be removed just before electroless plating to ensure a pristine seed layer 130 surface.

Figure 2:
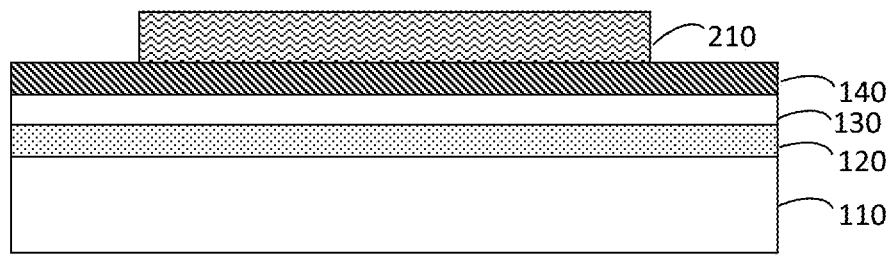
FIG. 2 is a cross-sectional view of the substrate of FIG. 1 having a lithographic resist mask patterned on the seed layer.

Referring to FIG. 2, a resist 210, such as a photoresist or mask, is applied to a surface of the seed layer 130, or to the top layer 140, if employed. The resist 210 is patterned to achieve the desired shape of the seed layer 130, as will be described below.

Figure 3:
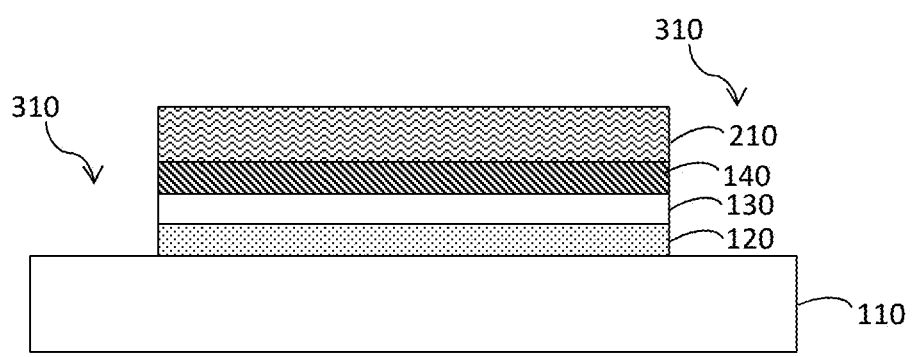
FIG. 3 is a cross-sectional view of the substrate of FIG. 2 having the protective layer, the seed layer, and the adhesion layer patterned.

Referring to FIG. 3, lithographic patterning of the seed layer 130 is performed. Lithographic patterning includes transferring the pattern of the patterned resist 210 into the adhesion and top layers 120, 140, if employed. In any case, the seed layer 130 is patterned using the resist 210. A wet etch may be employed to remove the seed layer 130, and optionally the adhesion layer 120, from field region 310. The resist 210 and the untreated top layer 140 may be removed to expose the pristine seed layer 130 in the appropriate shape onto which electrolessly deposited structures may be formed. Other methods may also be employed to pattern or expose an appropriate seed layer 130 portion.

Figure 4:
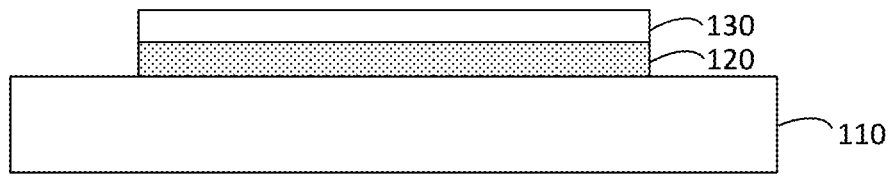
FIG. 4 is a cross-sectional view of the substrate of FIG. 3 having the resist layer and the protective layer removed.

Referring to FIG. 4, the resist 210 is removed, and the top layer 140 is removed, if present. Palladium activation is performed on the seed layer 130. Palladium activation includes immersing the substrate 110 in a palladium-containing solution. For example, a palladium sulfate solution can be used. Other palladium-containing solutions and palladium salts and compounds can be used. Non-limiting examples of suitable palladium salts include palladium chloride, palladium bromide, palladium iodide, palladium acetate, palladium nitrate, or any combination thereof. The amount of palladium in an activating solution is in an amount in a range from about 40 to about 70 parts per million (ppm). In another aspect, the amount of palladium in an activating solution is from about 1 to about 100 ppm, from about 10 to about 100 ppm, or from about 45 to about 65 ppm.

In an exemplary embodiment, palladium sulfate is added to the seed layer in the presence of an acid. Examples of suitable acids include sulfuric acid, hydrochloric acid, nitric acid, or any combination thereof. The acid used can be a % acid solution, for example including from about 5% to 15% of the total volume. The immersion time and temperature for palladium activation can generally vary and is not intended to be limited. For example, the temperature can be room temperature (from about 20° C. to about 26° C.) or a temperature below or above room temperature. The immersion time can be from a few seconds (s) to a few minutes, for example from about 1 minute to about 5 minutes. In one aspect, the emersion time is about or in any range from about 5 s, 10 s, 15 s, 20 s, 25 s, 30 s, 60 s, 120 s, 180 s, 240 s, to 300 s.

Figure 5:
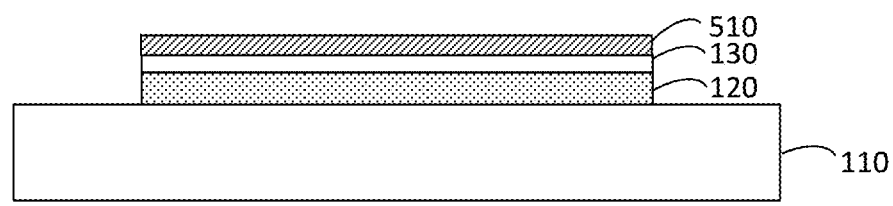
FIG. 5 is a cross-sectional view of the substrate of FIG. 4 having the seed layer palladium activated.

Referring to FIG. 5, the palladium-containing solution dissolves a portion of the seed layer 130 and creates a thin layer of palladium nanoparticles as an activated layer 510 on the seed layer 130 (activated seed layer). The palladium forms a discrete nano-sized layer on top of the seed layer 130, which forms the base of the electroless deposit (see FIG. 6).

Figure 6:
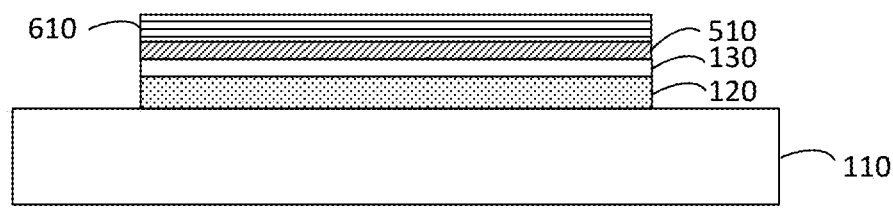
FIG. 6 is a cross-sectional view of the substrate of FIG. 5 having an electrolessly plated layer formed on the palladium activated layer.

Referring to FIG. 6, an electrolessly plated layer 610 is formed on the activated layer 510 of the seed layer 130. The electrolessly plated layer 610 is a magnetic alloy including nickel, iron, phosphorous, and in some embodiments boron, forming a Pd/NiFeP or a Pd/NiFePB film or layer. Electrolessly plated layer 610 can be selectively electrolessly plated on the patterned seed layer 130 to form on-chip magnetic structures, such as yokes, coils, or other structures. The Pd/NiFeP and Pd/NiFePB materials are amorphous or substantially amorphous. In another aspect, the Pd/NiFeP and Pd/NiFePB materials are soft or substantially soft materials and have an $H_c$ of about or less than 1.0 Oe. In other embodiments, the Pd/NiFeP and Pd/NiFePB materials have an $H_c$ of less than 5.0, 4.0, 3.0, or 2.0 Oe.

In another embodiment, the Pd/NiFeP and Pd/NiFePB materials are free of granular structures (e.g., grains), or substantially free of granular structures. Still yet, in other embodiments, the Pd/NiFeP and Pd/NiFePB materials are free of crystalline structures (e.g., crystals or nanocrystals), or are substantially free of crystalline structures.

The substrate 110 is immersed in an electroless bath to form electrolessly plated layer 610 and the resulting Pd/NiFeP and Pd/NiFePB materials. The Pd/NiFeP and Pd/NiFePB materials can be films. The Pd/NiFeP material includes a nickel in a range from about 0.1 to about 80 at. %, iron in a range from about 0.1 to about 50 at. %, and phosphorous in a range from about 0.1 to about 30 at. %. In one aspect, nickel is present in the Pd/NiFeP material in an amount in a range from about 50 to about 70 at. %, or from about 55 to about 65 at. %. In another aspect, nickel is present in the Pd/NiFeP material in an amount about or in any range from about 1, 5, 10, 20, 30, 40, 50, 60, 70, to 80 at. %.

Yet, in another aspect, iron is present in the Pd/NiFeP material in an amount in a range from about 10 to about 30 at. %, or from about 15 to about 25 at. %. Still yet, in another aspect, iron is present in the Pd/NiFeP material in an amount about or in any range from about 0.1, 1, 5, 10, 15, 20, 25, 30, 35, 40, 45, to 50 at. %.

In one aspect, phosphorous is present in the Pd/NiFeP in an amount in a range from about 10 to about 30 at. %, from about 8 to about 25 at. %, or from about 15 to about 20 at. %. In another aspect, phosphorous is present in the Pd/NiFeP material in an amount about or in any range from about 0.1, 1, 5, 10, 15, 20, 25, to 30 at. %.

When the electrolessly plated layer further includes boron as a Pd/NiFePB layer, the above-cited nickel, iron, and phosphorous ranges for the Pd/NiFeP material will be included, along with boron in an amount in a range from about 0.1 to 5 at. %. In one aspect, the Pd/NiFePB material includes boron in an amount in a range from about 0.5 at % to about 2 at. %. In another aspect, the Pd/NiFePB material includes boron in an amount in about or in any range from about 0.1, 1, 2, 3, 4, to 5 at. %.

The thickness of the electrolessly plated layer 610 can generally vary. In one aspect, the thickness of the electrolessly plated layer 610 is in a range from about 50 nm to about 5 microns. In another aspect, the thickness of the electrolessly plated layer 610 is in a range from about 100 nm to about 2 microns. Yet, in another aspect, the thickness of the electrolessly plated layer 610 is in a range from about 100 nm to about 1 micron.

Electroless plating is performed in the presence of a field bias. The apparatus can include a permanent magnet for applying a field bias, which can generally vary. In one embodiment, the field bias is from about 0.1 to about 1.5 Tesla during plating. The electroless solution is placed between the magnetic poles. The electroless solution can be heated to a constant temperature. The substrate 110 to be electrolessly plated is then placed inside the electroless solution. The surface of the substrate 110 is then coated with a seed layer 130, and optionally an adhesive layer 120 and top layer 140. The seed layer 130 is optionally deposited in the presence of an applied magnetic field to produce thin films with magnetic anisotropy. The deposition time and temperature can generally vary.

The above-disclosed ranges of nickel, iron, phosphorous, and in some embodiments, boron, on a palladium-activated seed layer provide Pd/NiFeP or Pd/NiFePB magnetic materials with both high resistivity and high magnetic flux. The deposition as described is conformal and the material is optimally suited for the top magnetic layer of an on-chip inductor because it is compatible with the thermal budget (stable up to a temperature of about 250° C.) for integration of an on-chip inductor device.

Generally, resistivity can be compromised in materials having high magnetic flux. However, surprisingly, the method described herein for electrolessly plating a layer of nickel, iron, phosphorous, and boron in some embodiments, in the described proportions and on a palladium activated seed layer, provides Pd/NiFeP and Pd/NiFePB materials with desired properties, in particular with resistivities greater than 90, 95, 100, 105, and 110 $\mu\Omega$·cm and ability to withstand high temperature anneals (at least 200 and 250° C.) for at least 1 hour without substantial degradation of the magnetic moment and the soft magnetic properties.

Following palladium activation, the palladium seed nucleation sites also pin the microstructure of the Pd/NiFeP and Pd/NiFePB materials and keep them amorphous to a temperature of at least 200° C. Grains or crystal formation within the Pd/NiFeP and Pd/NiFePB materials results in films that are magnetically unstable. In one embodiment, the Pd/NiFeP and Pd/NiFePB materials described herein are substantially amorphous from about room temperature to about 200° C. In another embodiment, the Pd/NiFeP and Pd/NiFePB materials are substantially amorphous to about 250° C.

The electroless solution includes a source of nickel, iron, phosphorous, and in some embodiments, boron. The deposition time and temperature can generally vary. In an exemplary embodiment, the deposition rate is from about 10 to about 100 nm per minute. In another exemplary embodiment, the deposition temperature is from about 50 to about 100° C., from about 55 to about 75° C., or from about 60 to about 75° C.

Non-limiting examples of suitable nickel sources include nickel salts, such as nickel sulfate, nickel sulfate hexahydrate, nickel nitrate, nickel chloride, nickel acetate, nickel carbonate, or any combination thereof. The nickel source may be included in a wide range of concentrations. In one embodiment, the concentration is range about 40 millimolar (mM) and about 80 mM. In another embodiment, the concentration is from about 50 mM to and 70 mM.

Non-limiting examples of suitable iron sources include iron salts, such as iron (III) salts. Non-limiting examples of suitable iron salts include ferric nitrate, ferric chloride, ferric acetate, ferric ammonium sulfate, ferric ammonium chloride, ferric hydroxide, and ferric oxide. The iron source may be included in a wide range of concentrations. In one embodiment, the concentration is from about 2 mM to about 22 mM. In another embodiment, the concentration is from about 8 mM to about 16 mM.

The electroless solution includes a source of phosphorous, which can also function as a reducing agent. Non-limiting examples of a suitable phosphorous sources/reducing agents include sodium hypophosphite or sodium hypophosphite monohydrate. The sodium hypophosphite may be included in a wide range of concentrations. In one embodiment, the concentration is from about 100 mM to about 500 mM. In another embodiment, the concentration is from about 250 mM to about 450 mM.

When forming Pd/NiFePB materials, the electroless solution further includes a source of boron, such as boron salts, in addition to the above nickel, iron, and phosphorous sources. The boron source can simultaneously function as a reducing agent. Non-limiting examples of suitable boron salts and boron-containing compounds include borohydride, boronitride, boron trichloride, boron trifluoride, boron triiodide, boron tribromide, boron oxide, boron phosphate, dimethylamine borane, morpholine borane, dimethylamino borane, dimethylsulfide borane, t-butylamine borane, ammonia borane, N,N-diethylaniline borane, diphenylphosphine borane, dimethylaminopyridine borane, ethylmorpholine borane, methylmorpholine borane, 2,6-lutidine borane, morpholine borane, oxathiane borane, phenylmorpholine borane, pyridine borane, tetrahydrofuran borane, tributylphosphine borane, triethylamine borane, trimethylamine borane, hydrates thereof, or any combination thereof. The boron source may be included in a wide range of concentrations. In one embodiment, the concentration is from about 10 mM to about 200 mM. In another embodiment, the concentration is from about 25 mM to about 75 mM.

The electroless solution includes ammonia and sodium potassium tartrate, which functions as a metal complexing agent. Citrate, tartrate, oxalate, succinate and amino acids are non-limiting examples of suitable metal complexing agents. The ammonia may be included in a wide range of concentrations. In one embodiment, the concentration is from about 10 mM to about 100 mM. In another embodiment, the concentration is from about 25 mM to about 75 mM.

The electroless solution can include additional additives, such as other complexing agents, buffers and surfactants. Non-limiting examples of suitable complexing agents include citric acid, lactic acid, tartaric acid (e.g., sodium potassium tartrate), succinic acid, oxalic acids, amino acids, salts thereof, and mixtures thereof. The concentration of the complexing agent can generally vary. In one embodiment, the concentration of the complexing agent is from about 20 mM to about 220 mM. In an exemplary embodiment, the concentration of the complexing agent is from about 70 to about 170 mM.

The electroless solution is adjusted to a pH of about 9 to 13. In one embodiment, the pH is from about 10.5 to about 11.5. In another embodiment, the pH is greater than about 10.

After electroless plating, annealing is performed in a vacuum furnace in the presence of a magnetic field bias. The time and temperature for annealing can generally vary. In one embodiment, the electrolessly plated substrates are annealed at a temperature from about 200 to about 250° C. for a time from about 15 to about 60 minutes.

After a 200° C. or 250° C. anneal for 1 hour, Pd/NiFeP and Pd/NiFePB films described herein maintain their magnetic properties, or are magnetically stable. For example, the difference in the hard axis $H_c$ after deposition and then after annealing to 200° C. is less than about 0.5 Oe. In some embodiments, the difference in the hard axis $H_c$ after deposition and annealing to 200° C. or 250° C. is less than 0.8, 0.7, 0.6, 0.5, 0.4, 0.3, 0.2, and 0.1 Oe, indicating that the magnetic properties are maintained after the anneal. In another embodiment, the hard axis $H_c$ is less 1.0 Oe. Yet in another embodiment, the Pd/NiFeP and Pd/NiFePB materials are magnetically stable to at least 200° C. for at least 1 hour. The Pd/NiFeP and Pd/NiFePB films also maintain high resistivity after annealing as described above. In one embodiment, the resistivity is at least 110 $\mu\Omega \cdot$cm after annealing. In another embodiment, the resistivity is at least 100 $\mu\Omega \cdot$cm after annealing. Yet, in another embodiment, the resistivity is at least 90, at least 95, at least 105, at least 115, at least 120, or at last 125 $\mu\Omega \cdot$cm after annealing.

EXAMPLES

Example 1

In all examples, a 55 ppm palladium sulfate solution in 10% sulfuric acid was used for 3 minutes at room temperature to activate the NiFe seed for plating. The palladium dissolved the NiFe seed layer and created a 10-50 angstrom (A) thin layer of nanoparticles on the surface. An electroless bath, which contained nickel sulfate, ferric ammonium sulfate, dimethylamineborane as a reducing agent, and sodium potassium tartrate and ammonia as metal complexing agents was used for the NiFeB electroless deposition as shown in Table 1. The rate of NiFeB deposition was 30 nm/min.

TABLE 1

| | |
|---|---|
| Sodium Potassium Tartarate | 0.12M |
| Ammonia (Aqueous) | 0.06M |
| Nickel Sulfate Hexahydrate | 0.059M |
| Ferric Ammonium Sulfate | 0.012M |
| Dimethylamine Borane | 0.05M |
| pH | 11.0 |
| Temp. | 65° C. |

Example 2

For the NiFeP deposition, the same solution for the growth of NiFeB was used, except dimethylamineborane (DMAB) was substituted with sodium hypophosphite. The electroless solution composition for the growth of the NiFeP films and operating conditions are shown in Table 2. The growth rate of NiFeP, which was 45 nm/min, was comparable and even faster than the deposition rate of NiFeB. The faster growth rate was likely due to the higher concentration of hypophosphite (0.34 M) in the NiFeP solution than DMAB (0.05M) in the NiFeB solution.

TABLE 2

| | |
|---|---|
| Sodium Potassium Tartarate | 0.12M |
| Ammonia (Aqueous) | 0.06M |
| Nickel Sulfate | 0.059M |
| Ferric Ammonium Sulfate | 0.012M |

TABLE 2-continued

| | |
|---|---|
| Sodium Hypophosphite | 0.34M |
| pH | 11.0 |
| Temp. | 70° C. |

Example 3

Figure 7:
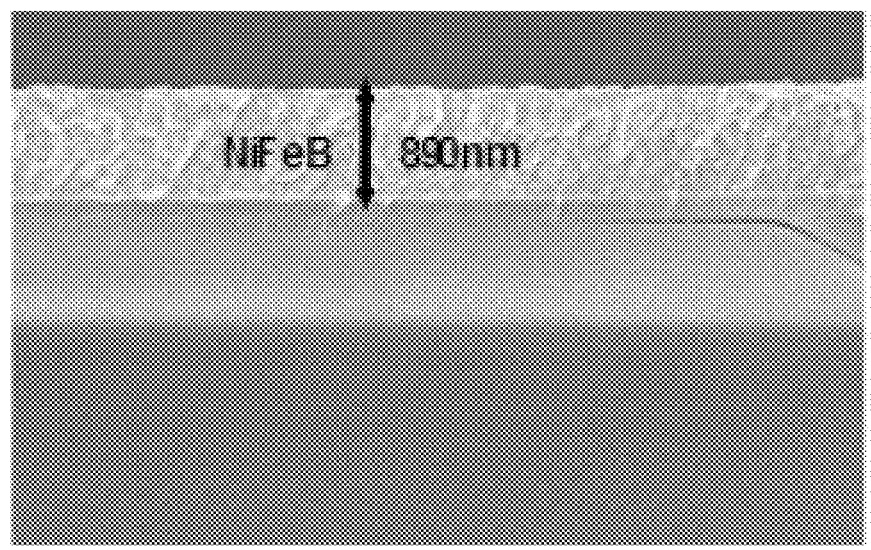
FIG. 7 is a cross-sectional scanning electron microscope (SEM) image of a Pd/NiFeB film.

The Pd/NiFeB films (see cross-sectional SEM in FIG. 7) contained only a small amount of boron (1%), which was enough to increase the resistivity of the layer to 56µΩ·cm after an annealing cycle to 250° C. The film was initially crystalline, and the resistivity dropped by about 14% with annealing to 250° C. as shown in Table 3.

TABLE 3

FX01-18
NiFe/PdFeNiB 30 min 65° C.

| | As Plated | Anneal 250° C. Heraeus |
|---|---|---|
| 1 | 0.76 | 0.61 |
| 2 | 0.56 | 0.65 |
| 3 | 0.85 | 0.60 |
| 4 | 0.69 | 0.68 |
| 5 | 0.47 | 0.41 |
| 6 | 0.81 | 0.72 |
| 7 | 0.78 | 0.72 |
| 8 | 0.73 | 0.61 |
| 9 | 0.84 | 0.71 |
| Mean—Ohms/Square | 0.72 | 0.63 |
| Resistivity, µohm cm | 64 | 56 |

Example 4

Figures 8A, 8B:
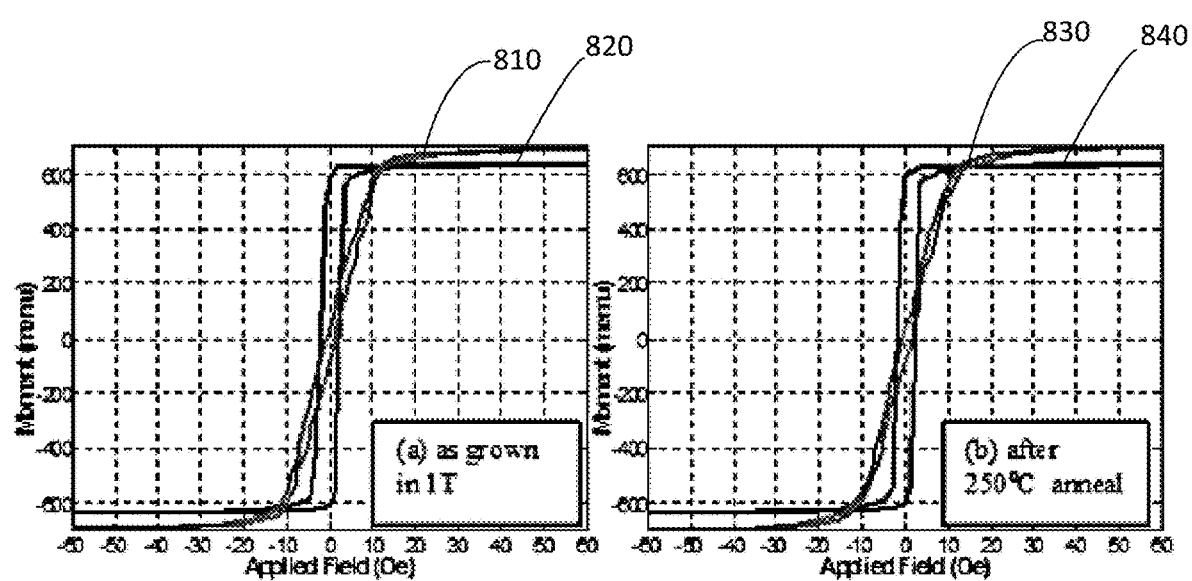
FIG. 8A is a graph showing moment electromagnetic units (emu) as a function of applied field (Oe) for an as-deposited Pd/NiFeB layer.
FIG. 8B is a graph showing moment (emu) as a function of applied field (Oe) for the Pd/NiFeB layer of FIG. 8A after annealing to 250° C. for 1 hour.

FIGS. 8A and 8B show that the NiFeB film was thermally stable to 250° C. and that the magnetic properties improved somewhat with annealing. In particular, FIG. 8A shows magnetics measurements of a 890 nm Pd/NiFeB layer as deposited in the presence of a 1 Tesla magnetic field (easy axis 820, hard axis 810). The hard axis $H_c$ was 1.0 Oe.

FIG. 8B shows the Pd/NiFeB layer after annealing to 250° C. for 1 hour (easy axis 840, hard axis 830). The hard axis $H_c$ was 0.84 Oe. Thus, the soft magnetic properties of the as-deposited Pd/NiFeB layers remained approximately constant with thermal annealing.

Example 5

Figure 9A:
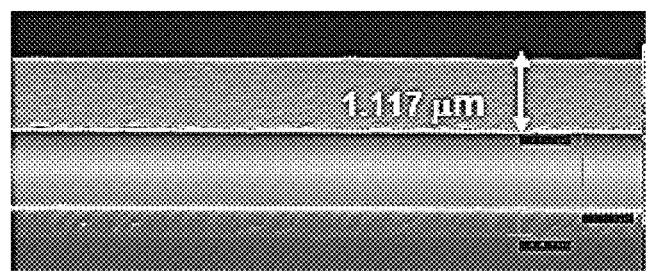
FIG. 9A is a cross-sectional SEM image of a Pd/NiFeP film.
Figure 9B:
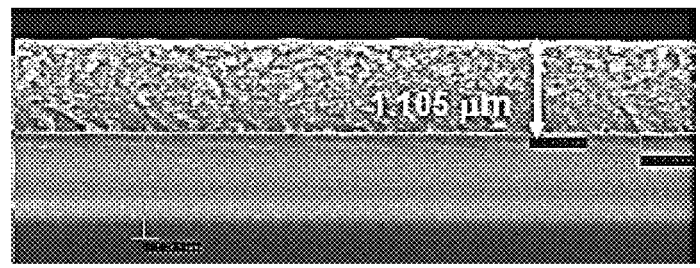
FIG. 9B a cross-sectional SEM image of a Pd/NiFeP film.

Table 4 shows that the measured resistivity of the Pd/NiFeP films were equal to 110 and 115 µΩ·cm when grown to a thickness of about 1.1 mm (see cross-sectional SEM images in FIGS. 9A and 9B). The resistivity of the Pd/NiFeP films dropped by 25% upon annealing to 250° C., which may have indicated a reaction of P with Ni and/or Fe. A likely reaction was further reinforced further by the fact that the phosphorous content of these films was very high, at 17%. Due to the high phosphorous content, a substantial amount of phosphorous was available to react with the magnetic metals and to form compounds.

TABLE 4

| Sample | [Ni] at. % | [Fe] at. % | [P] at. % |
|---|---|---|---|
| FWX1-9 | 64 ± 2 | 19 ± 2 | 17 ± 3 |
| FWX1-10 | 64 ± 2 | 19 ± 2 | 17 ± 3 |

| | FWX1-9 NiFe/PdFeNiP 25 min 70° C. | | FWX-10 NiFe/PdFeNiP 25 min 70° C. | |
|---|---|---|---|---|
| | As Plated | Anneal 250° C. Heraeus | As Plated | Anneal 250° C. Heraeus |
| | 1.29 | 0.91 | 1.32 | 1.03 |
| | 1.11 | 1.06 | 1.32 | 1.01 |
| | 1.11 | 1.10 | 1.36 | 1.03 |
| | 1.24 | 0.83 | 1.53 | 1.31 |
| | 1.10 | 0.92 | 1.39 | 1.15 |
| | 1.13 | 1.12 | 1.35 | 1.09 |
| | 1.33 | 0.73 | 1.29 | 1.00 |
| | 1.31 | 0.91 | 1.04 | 0.80 |
| | 1.14 | 1.11 | 1.15 | 0.92 |
| Mean—Ohms/Square | 1.20 | 0.97 | 1.31 | 1.04 |
| Resistivity, µohm cm | 136.7 | 110.5 | 145.30 | 115.30 |

Example 6

Figures 10A, 10B:
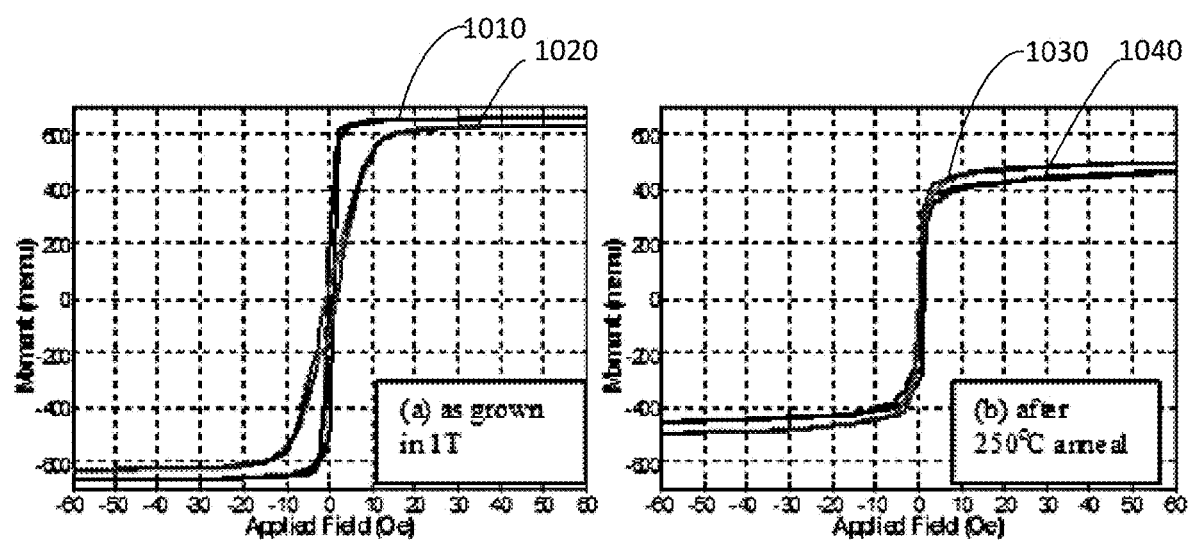
FIG. 10A is a graph showing moment (emu) as a function of applied field (Oe) for an as-deposited Pd/NiFeP layer.
FIG. 10B is a graph showing moment (emu) as a function of applied field (Oe) for the Pd/NiFeP layer of FIG. 10A after annealing to 250° C. for 1 hour.

FIGS. 10A, 10B, 11A, and 11B show the magnetic properties of the Pd/NiFeP films. In particular, FIG. 10A shows magnetics measurements of a 1.117 µm Pd/NiFeP layer as-deposited in the presence of a 1 Tesla magnetic field (easy axis 1010, hard axis 1020). The hard axis $H_c$ was 0.97 Oe. Thus, the as-deposited films exhibit soft magnetic properties with hard axis coercive force $H_c$ much lower than 1.0, anisotropy field $H_k$ of about 15, and high saturation magnetization.

FIG. 10B shows the Pd/NiFeP layer after annealing to 250° C. for 1 hour (easy axis 1040, hard axis 1030). The hard axis $H_c$ was 0.1 Oe. Upon annealing to 250° C., the $H_c$ became even lower, the anisotropy field $H_k$ increased modestly to 18-20, but the moment was reduced by 25%, indicating a reaction of P with the magnetic elements of Fe and Ni to form inter metallic compounds.

Figures 11A, 11B:
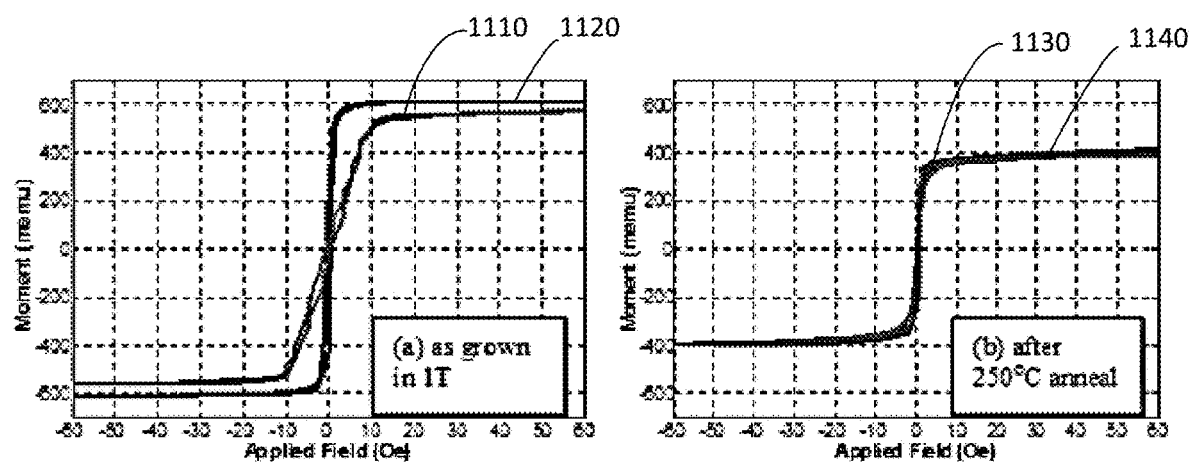
FIG. 11A is a graph showing moment (emu) as a function of applied field (Oe) for a for an as-deposited Pd/NiFeP layer.
FIG. 11B is a graph showing moment (emu) as a function of applied field (Oe) for the Pd/NiFeP layer of FIG. 11A after annealing to 250° C. for 1 hour.

FIG. 11A shows magnetics measurements of a 1.105 µm Pd/NiFeP layer as-deposited in the presence of a 1 Tesla magnetic field (easy axis 1120, hard axis 1110). The hard axis $H_c$ was 0.406 Oe. FIG. 11B shows the Pd/NiFeP layer after annealing to 250° C. for 1 hour (easy axis 1140, hard axis 1130). The hard axis $H_c$ was 0.196 Oe. Thus, the soft magnetic properties of the as-deposited Pd/NiFeP layers remained approximately constant with thermal annealing.

Example 7

Tables 5 below shows the resistivity of the NiFe/PdFeNiP materials as a function of annealing. As shown, magnetic properties are maintained when the films are first annealed at 150° C. for 30 minutes in a 1 Tesla magnetic field and then to 200 or 250° C. for 1 hour in a forming gas. The magnetic moment remains constant and resistivity drops by no more than 15% using this methodology.

TABLE 5

| As Plated | Anneal 150° C./10 T | Anneal 200° C. Heraeus |
|---|---|---|
| 0.84 | 0.91 | 0.87 |
| 0.81 | 0.85 | 0.73 |
| 0.90 | 0.84 | 0.72 |

TABLE 5-continued

|  | As Plated | Anneal 150° C./10 T | Anneal 200° C. Heraeus |
|---|---|---|---|
|  | 0.87 | 0.84 | 0.78 |
|  | 0.81 | 0.70 | 0.70 |
|  | 0.80 | 0.82 | 0.72 |
|  | 0.85 | 0.74 | 0.73 |
|  | 0.85 | 0.77 | 0.72 |
|  | 0.95 | 0.81 | 0.74 |
| Mean ohms/sq | 0.85 | 0.81 | 0.75 |
| Resist. μohm cm | 115 | 109 | 101 |

Table 6 below shows the resistivity of NiFe/PdFeNiPB materials as a function of annealing at 150° C. for 30 minutes in a 1 Tesla magnetic field and then to 200 or 250° C. for 1 hour in a forming gas.

TABLE 6

|  | As Plated | Anneal 150° C./10 T | Anneal 250° C. Heraeus |
|---|---|---|---|
|  | 1.08 | 1.13 | 1.06 |
|  | 1.07 | 0.99 | 1.23 |
|  | 1.25 | 1.12 | 0.93 |
|  | 1.31 | 1.23 | 1.13 |
|  | 1.18 | 1.29 | 1.17 |
|  | 1.56 | 1.46 | 0.92 |
|  | 1.11 | 0.98 | 1.14 |
|  | 1.08 | 1.01 | 1.29 |
|  | 1.22 | 1.09 | 1.03 |
| Mean ohms/sq | 1.21 | 1.14 | 1.10 |
| Resist, μohm cm | 119.8 | 112.9 | 108.9 |

Figure 12A:
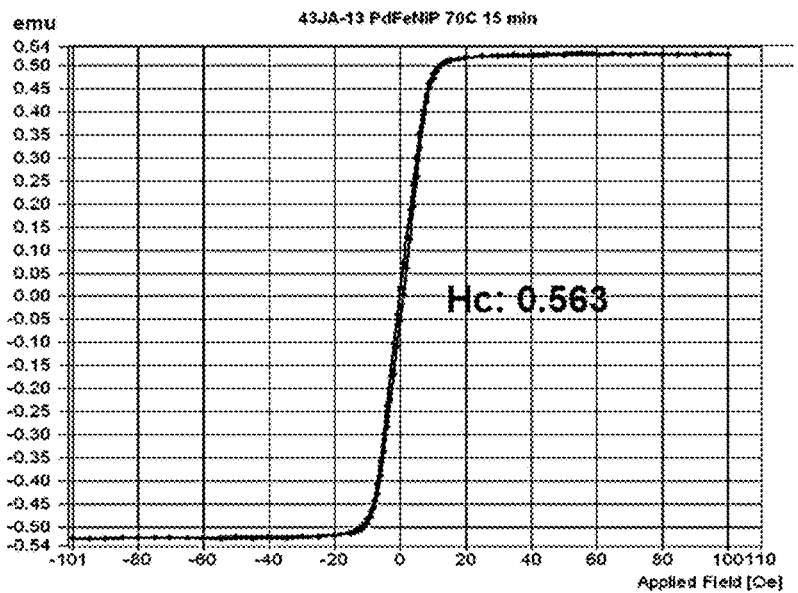
FIG. 12A is a graph showing moment (emu) as a function of applied field (Oe) for an as-deposited Pd/NiFeP layer.
Figure 12B:
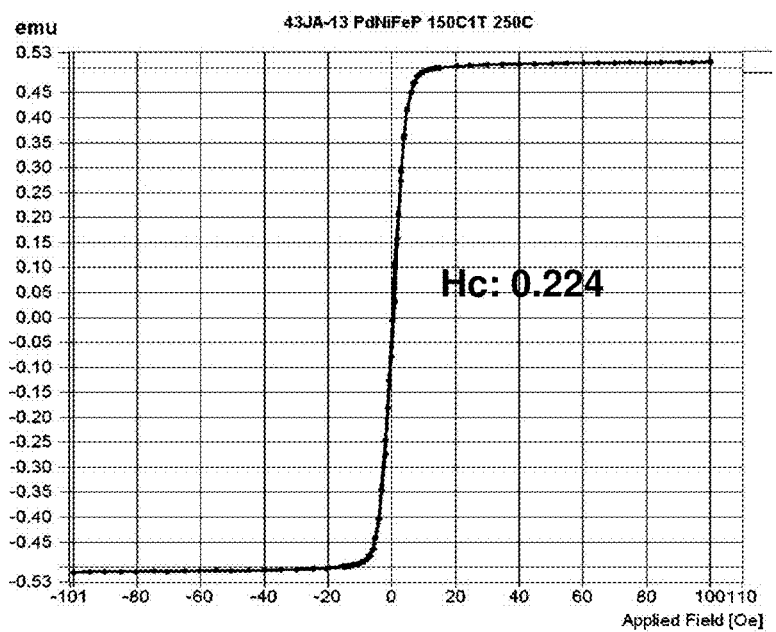
FIG. 12B is a graph showing moment (emu) as a function of applied field (Oe) for the Pd/NiFeP layer of FIG. 12A after annealing at 150° C. in a magnetic field bias for 30 min and then at 250° C. for 1 hour.

FIGS. 12A and 12B are graphs showing the hard axis magnetics $H_c$ of the Pd/NiFeP film in Table 5. The as-plated $H_c$ was 0.563 Oe (FIG. 12A), and after annealing at 150° C. for 30 minutes in a 1 Tesla magnetic field and then to 200 or 250° C. for 1 hour, the $H_c$ was 0.224 Oe (FIG. 12B). Thus, the Pd/NiFeP moment was constant, and the resistivity dropped by only 14% with a 150° C., 1 Tesla anneal followed by a 250° C., 1 hour anneal.

Figure 13A:
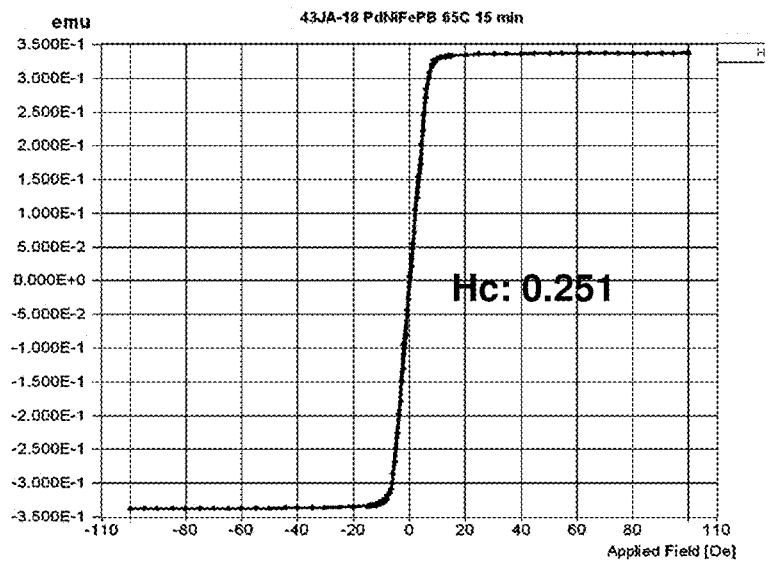
FIG. 13A is a graph showing moment (emu) as a function of applied field (Oe) for an as-deposited Pd/NiFeBP layer.
Figure 13B:
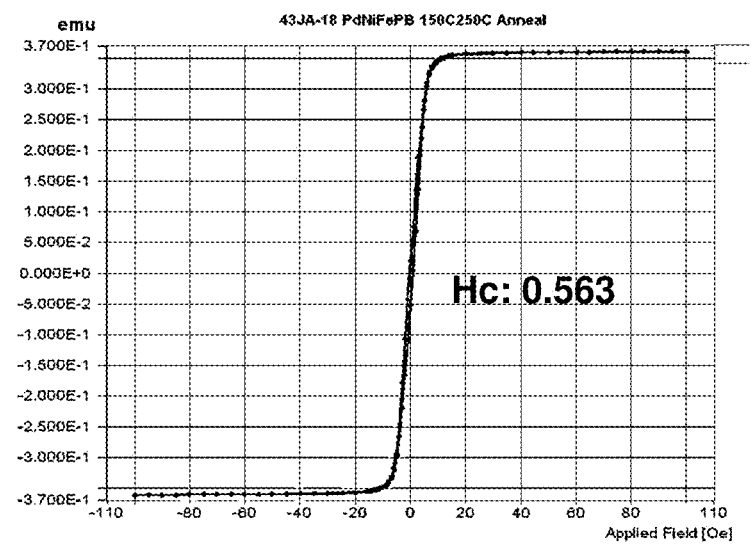
FIG. 13B is a graph showing moment (emu) as a function of applied field (Oe) for the Pd/NiFeBP layer of FIG. 13A after annealing at 150° C. in a magnetic field bias for 30 min and then at 250° C. for 1 hour.

FIGS. 13A and 13B are graphs showing the hard axis $H_c$ of the Pd/NiFePB film in Table 6. The as-plated $H_c$ was 0.251 Oe (FIG. 13A), and after annealing at 150° C. for 30 minutes in a 1 Tesla magnetic field and then to 200 or 250° C. for 1 hour, the $H_c$ was 0.563 Oe (FIG. 13B). Thus, the Pd/NiFePB moment was constant, and the resistivity dropped by only 10% with a 150° C., 1 Tesla anneal followed by a 250° C., 1 hour anneal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An on-chip magnetic structure, comprising:
   a semiconductor substrate comprising at least one of gallium arsenide, indium phosphide, and silicon carbide;
   a seed layer arranged directly on the semiconductor substrate, the seed layer comprising a nickel iron alloy;
   an activated layer arranged directly on the seed layer, the activated layer comprising palladium nanoparticles; and
   an electroless plated layer arranged directly on the palladium nanoparticles, the electroless plated layer comprising amorphous magnetic material disposed directly onto the palladium nanoparticles to form a Pd/NiFeP material comprising nickel in a range from 20 to 71 atomic % (at. %) based on a total number of atoms of the magnetic material, iron in a range from 10 to 50 at. % based on the total number of atoms of the magnetic material, and phosphorous in a range of about 20 at. % based on the total number of atoms of the magnetic material, wherein the palladium nanoparticles pin a microstructure of the amorphous magnetic material to maintain an amorphous state at a temperature of about 250° C.;
   wherein the amorphous magnetic material has a thickness in a range from about 50 nanometers to about 5 micrometers.

2. The on-chip magnetic structure of claim 1, wherein the magnetic material further comprises boron in an amount in a range from about 0.1 to about 5 at. % based on the total number of atoms of the magnetic material.

3. The on-chip magnetic structure of claim 1, wherein the magnetic material has a resistivity of at least 100 micro-ohm·centimeters (μΩ·cm).

4. The on-chip magnetic structure of claim 1, wherein the on-chip magnetic structure is a yoke or a coil.

5. The on-chip magnetic structure of claim 1, wherein the palladium nanoparticles are formed by immersing the seed layer in a palladium-containing solution in a presence of an acid.

6. The on-chip magnetic structure of claim 5, wherein the palladium-containing solution is palladium sulfate.

7. The on-chip magnetic structure of claim 5, wherein the acid is sulfuric acid, hydrochloric acid, nitric acid, or any combination thereof.

* * * * *